(12) United States Patent
Chang et al.

(10) Patent No.: US 11,272,645 B2
(45) Date of Patent: Mar. 8, 2022

(54) ELECTRONIC DEVICE AND ELECTROMAGNETIC SHIELDING FRAME

(71) Applicant: WISTRON NEWEB CORPORATION, Hsinchu (TW)

(72) Inventors: Jen-Yung Chang, Hsinchu (TW); Tiao-Ming Hsu, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 0 days.

(21) Appl. No.: 17/009,181

(22) Filed: Sep. 1, 2020

(65) Prior Publication Data

US 2021/0274692 A1   Sep. 2, 2021

(30) Foreign Application Priority Data

Mar. 2, 2020   (TW) ................. 109106655

(51) Int. Cl.
*H05K 1/11*  (2006.01)
*H05K 9/00*  (2006.01)
*H05K 1/18*  (2006.01)

(52) U.S. Cl.
CPC .......... *H05K 9/0028* (2013.01); *H05K 1/111* (2013.01); *H05K 1/18* (2013.01); *H05K 2201/09418* (2013.01); *H05K 2201/10371* (2013.01)

(58) Field of Classification Search
CPC .................................................. H05K 9/0028
USPC ....................................................... 174/363
See application file for complete search history.

(56) References Cited

U.S. PATENT DOCUMENTS

| 2,664,844 | A  | * | 1/1954  | Siegrist  | H01R 4/022 228/56.3 |
| 2008/0192446 | A1 | * | 8/2008  | Hankofer  | H05K 3/301 361/752 |
| 2019/0318874 | A1 | * | 10/2019 | Orimo     | H05K 3/3442 |

FOREIGN PATENT DOCUMENTS

CN   2650333 Y   10/2004
CN   102955527 B   3/2019

* cited by examiner

*Primary Examiner* — Stanley Tso
(74) *Attorney, Agent, or Firm* — McClure, Qualey & Rodack, LLP

(57) ABSTRACT

An electronic device and an electromagnetic shielding frame are provided. The electromagnetic shielding frame includes a ring-shaped portion and a plurality of soldering tabs that extend from the ring-shaped portion along a protruding direction. The soldering tabs are spaced apart from each other and are in a ring-shaped arrangement. At least one of the soldering tabs has a patterned slot layout so as to be defined as a patterned tab. A portion of the patterned slot layout of the patterned tab arranged away from the ring-shaped portion has a layout distance. The patterned slot layout is arranged along a first direction and a second direction. The first direction and the protruding direction have a first angle therebetween that is smaller than 90 degrees, and the second direction and the protruding direction have a second angle therebetween that is smaller than 90 degrees.

18 Claims, 13 Drawing Sheets

ELECTRONIC DEVICE AND ELECTROMAGNETIC SHIELDING FRAME

CROSS-REFERENCE TO RELATED PATENT APPLICATION

This application claims the benefit of priority to Taiwan Patent Application No. 109106655, filed on Mar. 2, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a shielding frame, and more particularly to an electronic device and an electromagnetic shielding frame.

BACKGROUND OF THE DISCLOSURE

A conventional electromagnetic shielding frame is soldered onto a circuit board through soldering tails thereof. Since solders on the circuit board are not easy to bond with the soldering tails of the conventional electromagnetic shielding frame, an empty soldering issue may easily occur in the soldering process of the conventional electromagnetic shielding frame and the circuit board, which reduces the manufacturing yield and the product reliability.

SUMMARY OF THE DISCLOSURE

In response to the above-referenced technical inadequacies, the present disclosure provides an electronic device and an electromagnetic shielding frame to effectively improve on the issues associated with conventional electromagnetic shielding frames.

In one aspect, the present disclosure provides an electronic device, which includes an electromagnetic shielding frame, a circuit board, an electronic component, and a plurality of solders. The electromagnetic shielding frame includes a ring-shaped portion and a plurality of soldering tabs. The soldering tabs extend from the ring-shaped portion along a protruding direction. The soldering tabs are spaced apart from each other and are in a ring-shaped arrangement. At least one of the soldering tabs has a patterned slot layout so as to be defined as a patterned tab. The patterned tab includes a bottom side arranged away from the ring-shaped portion, and a portion of the patterned slot layout of the patterned tab arranged adjacent to the bottom side has a layout distance. The patterned slot layout is arranged along a first direction and a second direction. The first direction and the protruding direction have a first angle therebetween that is smaller than 90 degrees, and the second direction and the protruding direction have a second angle therebetween that is smaller than 90 degrees. The circuit board has a first board surface and a second board surface that is opposite to the first board surface. The circuit board includes a plurality of soldering pads arranged on the first board surface in a ring-shaped arrangement, and the soldering pads are spaced apart from each other and respectively correspond in position to the soldering tabs. The electronic component is mounted on the first board surface of the circuit board, and is arranged in an accommodating space surroundingly defined by the electromagnetic shielding frame and the circuit board. The solders are respectively disposed on the soldering pads. The solders are connected to the soldering tabs, respectively, and the patterned tab is configured to allow the corresponding solder to climb onto the patterned slot layout along the first direction and the second direction.

In another aspect, the present disclosure provides an electromagnetic shielding frame, which includes a ring-shaped portion and a plurality of soldering tabs. The soldering tabs extend from the ring-shaped portion along a protruding direction. The soldering tabs are spaced apart from each other and are in a ring-shaped arrangement. At least one of the soldering tabs has a patterned slot layout so as to be defined as a patterned tab. The patterned tab includes a bottom side arranged away from the ring-shaped portion, and a portion of the patterned slot layout of the patterned tab arranged adjacent to the bottom side has a layout distance. The patterned slot layout is arranged along a first direction and a second direction. The first direction and the protruding direction have a first angle therebetween that is smaller than 90 degrees, and the second direction and the protruding direction have a second angle therebetween that is smaller than 90 degrees.

Therefore, since the patterned tab of the electromagnetic shielding frame in the present disclosure is formed with the patterned slot layout, the solder can climb onto at least part of the slots along the first direction or the second direction. Accordingly, surface area of the patterned tab covered by the solder can be effectively increased, and the connection between the patterned tab and the corresponding solder can be more firm.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
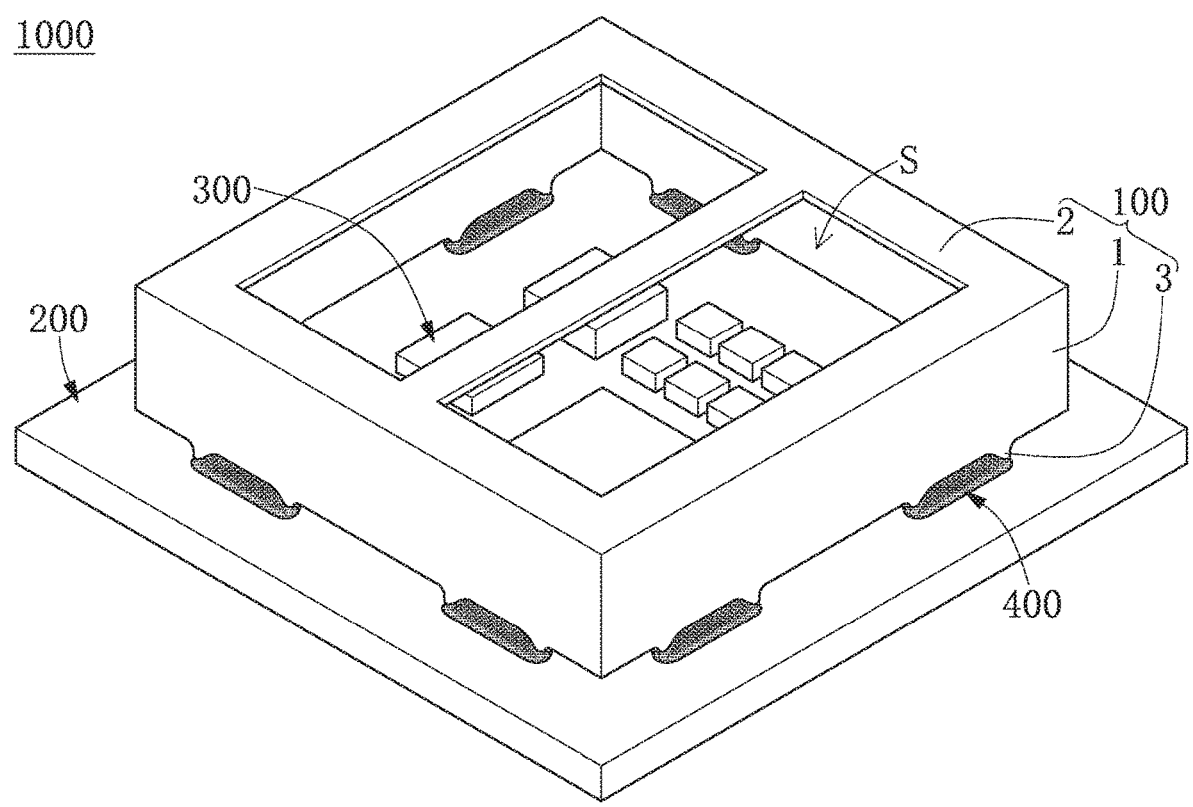
FIG. 1 is a perspective view of an electronic device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 12, a first embodiment of the present disclosure provides an electronic device 1000. The electronic device 1000 includes an electromagnetic shielding frame 100, a circuit board 200 in cooperation with the electromagnetic shielding frame 100, at least one electronic component 300 mounted on the circuit board 200, and a plurality of solders 400 that connect the electromagnetic shielding frame 100 and the circuit board 200. The following description describes the structure and connection relationship of each component of the electronic device 1000.

It should be noted that the electromagnetic shielding frame 100 in the present embodiment is described in cooperation with the circuit board 200, the at least one electronic component 300, and the solders 400, but the present disclosure is not limited thereto. For example, in other embodiments of the present disclosure, the electromagnetic shielding frame 100 can be independently used (e.g., sold) or can be used in cooperation with other components.

The electromagnetic shielding frame 100 in the present embodiment is integrally formed as a one piece structure, and any frame without having electromagnetic shielding function is different from the electromagnetic shielding frame 100 of the present embodiment. The electromagnetic shielding frame 100 includes a ring-shaped portion 1, a top board 2 connected to (a ring-shaped top edge of) the ring-shaped portion 1, and a plurality of soldering tabs 3 that extend from (a ring-shaped bottom edge of) the ring-shaped portion 1 along a protruding direction Dp.

The ring-shaped portion 1 in the present embodiment is in a square shape or a rectangular shape, and is perpendicularly connected to a peripheral edge of the top board 2 that can be substantially in a fence shape, but the present disclosure is not limited thereto. For example, in other embodiments of the present disclosure, the top board 2 can be formed in other shapes, or the electromagnetic shielding frame 100 can be provided without the top board 2 according to design requirements.

Figure 4:
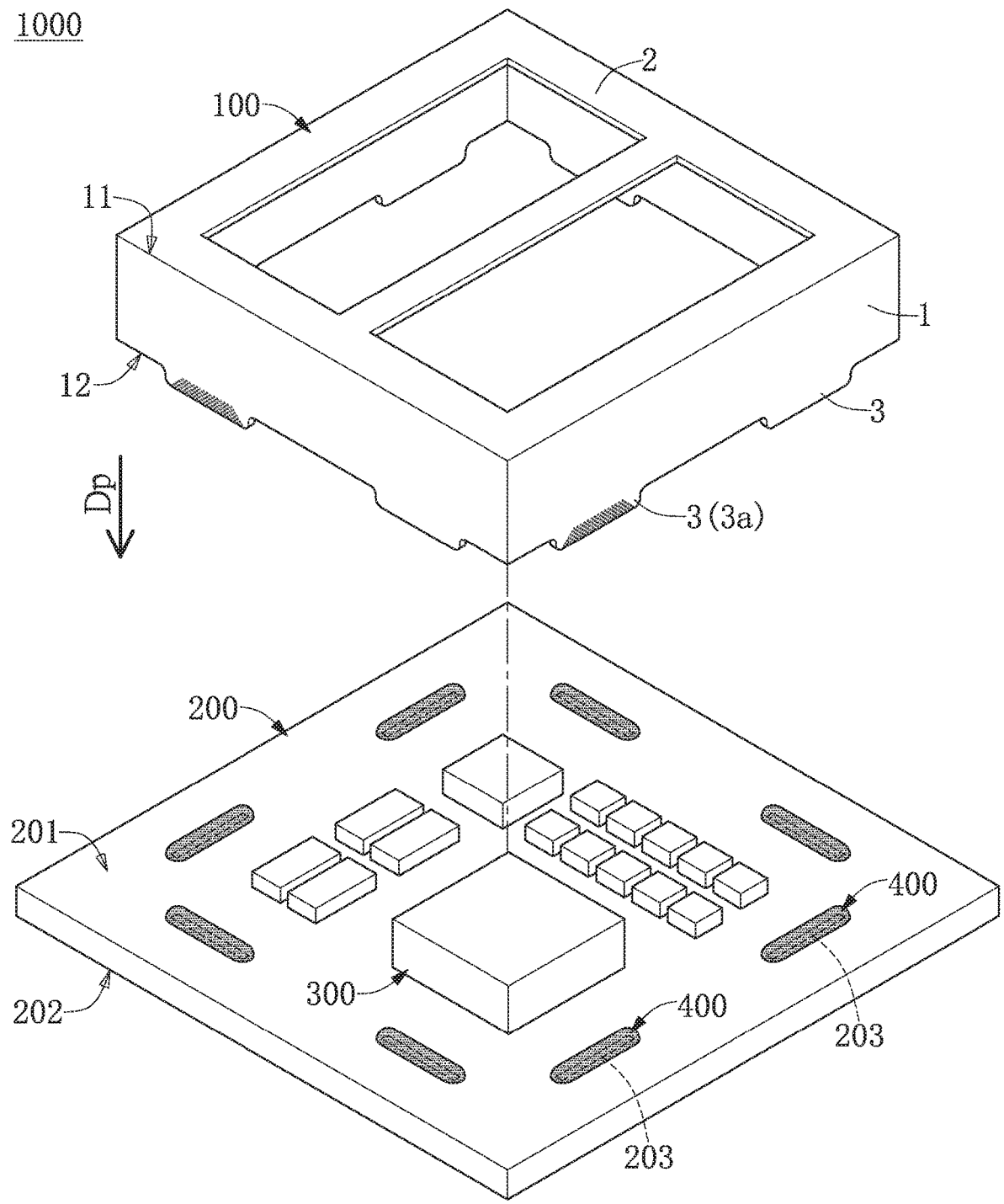
FIG. 4 is a perspective view of the electronic device in another configuration according to the first embodiment of the present disclosure.

The soldering tabs 3 are spaced apart from each other and are in a ring-shaped arrangement. Each of the soldering tabs 3 in the present embodiment has a patterned slot layout 31 so as to be defined as a patterned tab 3a, but the present disclosure is not limited thereto. For example, as shown in FIG. 4, the soldering tabs 3 of the electromagnetic shielding frame 100 can have at least one patterned tab 3a that has the patterned slot layout 31.

As the patterned tabs 3a (or the soldering tabs 3) in the present embodiment are of the substantially same structure, the following description discloses the structure of just one of the patterned tabs 3a (or the soldering tabs 3) for the sake of brevity. However, in other embodiments of the present disclosure, the patterned tabs 3a (or the soldering tabs 3) can be of different structure.

Figure 3:
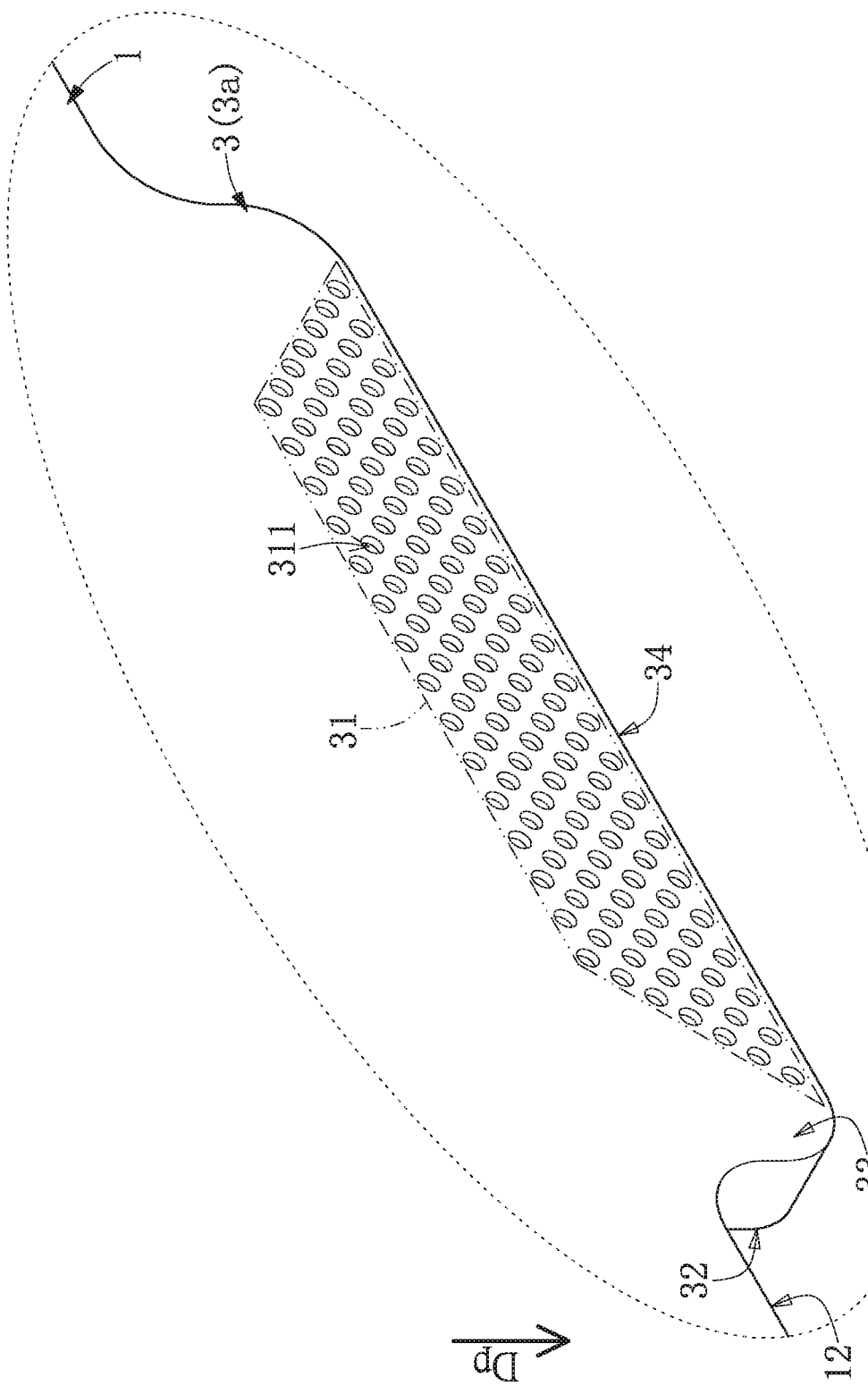
FIG. 3 is an enlarged view of part III of FIG. 2.
Figure 10:
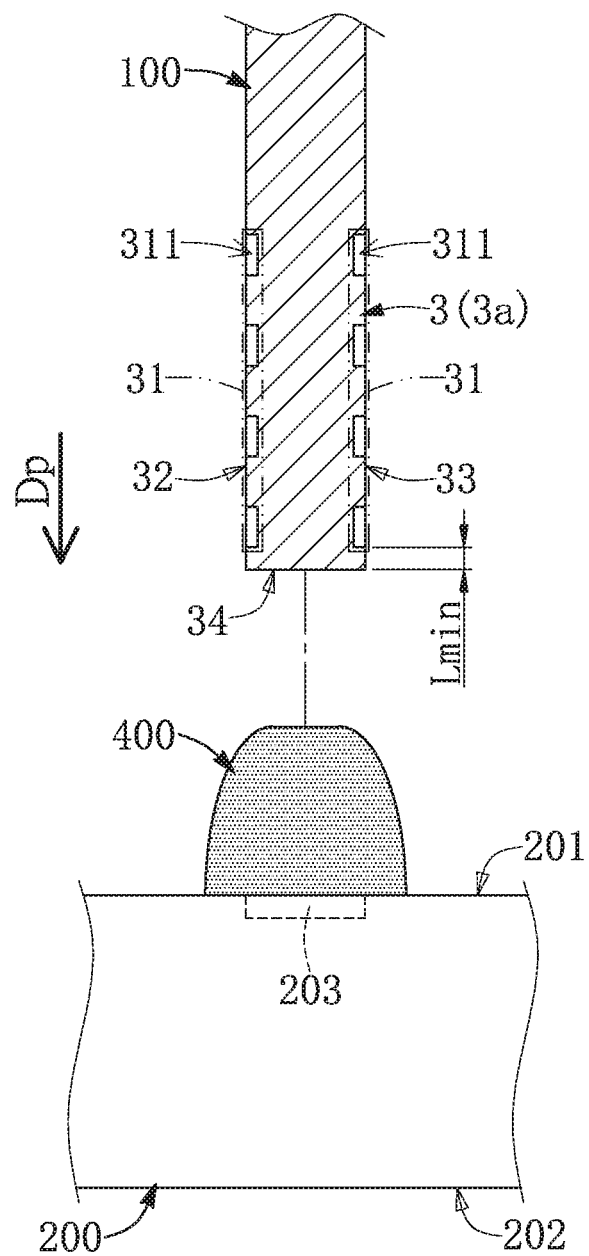
FIG. 10 is a cross-sectional view taken along line X-X of FIG. 9.
Figure 12:
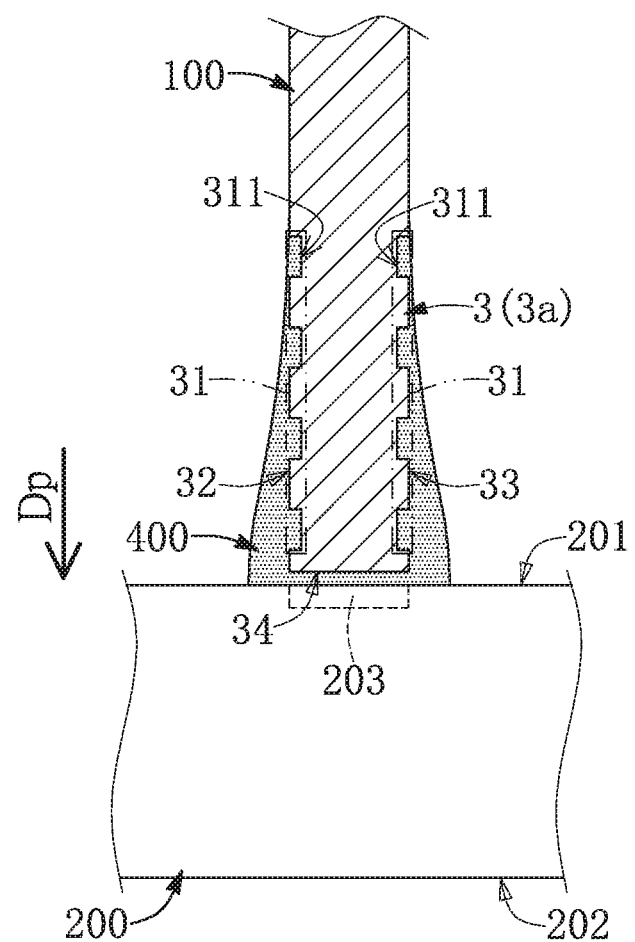
FIG. 12 is a cross-sectional view taken along line XII-XII of FIG. 11.

As shown in FIG. 3, the patterned tab 3a has an inner surface 32 and an outer surface 33 that is opposite to the inner surface 32. In the present embodiment, the inner surface 32 of the patterned tab 3a faces the electronic component 300, and the outer surface 33 of the patterned tab 3a is arranged away from the electronic component 300. As shown in FIG. 10 and FIG. 12, each of the inner surface 32 and the outer surface 33 of the patterned tab 3a in the present embodiment is formed with the patterned slot layout 31, and a projection region defined by orthogonally projecting the patterned slot layout 31 of the outer surface 33 onto the inner surface 32 is overlapped with the patterned slot layout 31 of the inner surface 32, but the present disclosure is not limited thereto.

For example, in other embodiments of the present disclosure, the projection region defined by orthogonally projecting the patterned slot layout 31 of the outer surface 33 onto the inner surface 32 can be partially overlapped with or not overlapped with the patterned slot layout 31 of the inner surface 32. Moreover, as shown in FIG. 4, the patterned slot layout 31 can be only formed on one of the inner surface 32 and the outer surface 33 of the patterned tab 3a.

Figure 5:
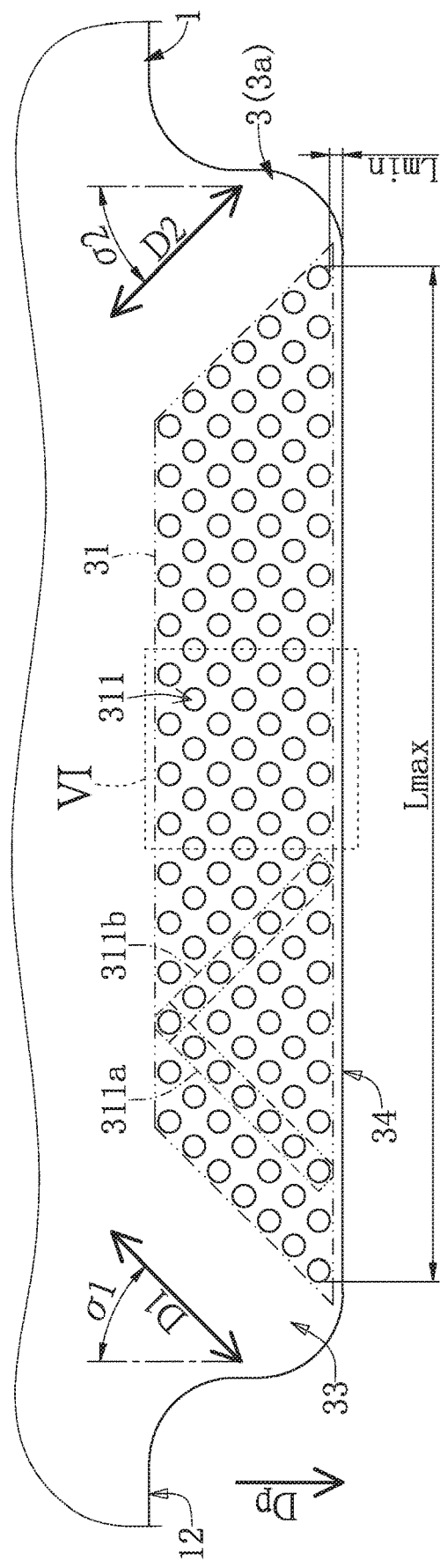
FIG. 5 is a planar view of FIG. 3.
Figure 6:
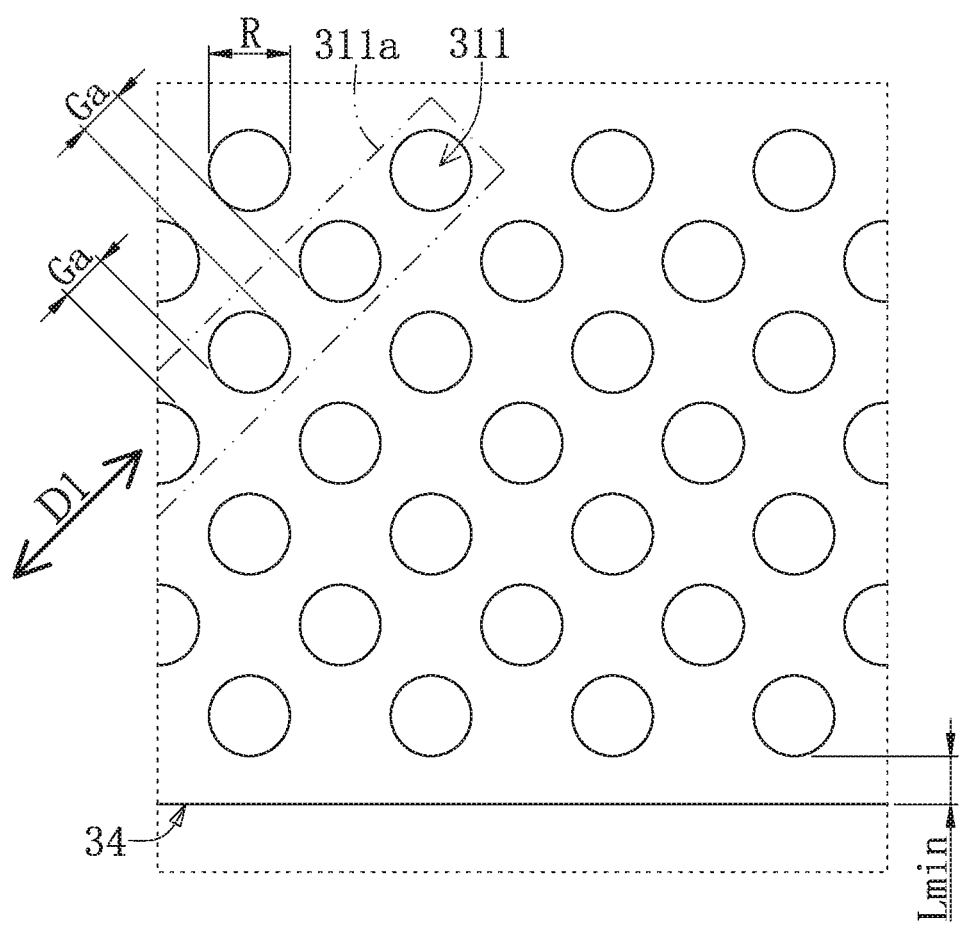
FIG. 6 is an enlarged view of part VI of FIG. 5.

Specifically, as shown in FIG. 3, FIG. 5, and FIG. 6, the patterned slot layout 3a in the present embodiment includes a plurality of slots 311 spaced apart from each other, and the shape of any one of the slots 311 can be adjusted or changed according to design requirements. For example, any one of the slots 311 can be in a prismatic shape shown in FIG. 7, a circular shape shown in FIG. 5, a square shape (not shown in figures), or a rectangular shape (not shown in figures). The patterned slot layout 31 does not extend across the ring-shaped bottom edge 12 and is not formed on the ring-shaped portion 1. In other words, the patterned slot layout 31 (or the slots 311) in the present embodiment cannot be formed on the ring-shaped portion 1.

Moreover, the patterned tab 3a includes a bottom side 34 arranged away from the ring-shaped portion 1, and a portion of the patterned slot layout 31 (e.g., the slots 311 of the lowest row shown in FIG. 5) of the patterned tab 3a arranged adjacent to the bottom side 34 has a maximum layout distance Lmax (or a layout distance). Specifically, a contour of the patterned slot layout 31 (or the slots 311) in the present embodiment is in a trapezoid shape, and the maximum layout distance Lmax corresponds in position to (or is substantially as long as) a bottom edge of the trapezoid, but the present disclosure is not limited thereto. For example, in other embodiments of the present disclosure, the contour of the patterned slot layout 31 can be in an irregular shape, a triangular shape, a square shape, or a rectangular shape.

The patterned slot layout 31 (or the slots 311) can be arranged (or patterned) along a first direction D1 and a second direction D2. The first direction D1 and the protruding direction Dp have a first angle σ1 therebetween that is smaller than 90 degrees, and the second direction D2 and the protruding direction Dp have a second angle σ2 therebetween that is smaller than 90 degrees.

It should be noted that the patterned slot layout 31 (or the slots 311) can be arranged in different types according to design requirements when satisfying the above conditions. The following description describes the patterned slot layout 31 that is provided in a preferable arrangement for facilitating the corresponding solder 400 to climb onto at least part of the slots 311, but the present disclosure is not limited thereto.

As shown in FIG. 5 and FIG. 6, the first angle σ1 is substantially equal to the second angle σ2, and the first angle σ1 in the present embodiment is preferably within a range of 30 to 60 degrees, but the present disclosure is not limited thereto. In other words, the first angle σ1 and the second angle σ2 can be adjusted or changed according to design requirements. However, a difference between the first angle σ1 and the second angle σ2 is preferably smaller than or equal to 10 degrees. On the other hand, the first direction D1 and the second direction D2 can have an angle therebetween that is within a range of 85-95 degrees.

Moreover, the slots 311 of the patterned slot layout 31 are arranged in a plurality of first columns 311a each parallel to the first direction D1 and a plurality of second columns 311b each parallel to the second direction D2. The first columns 311a and the second columns 311b intersect with each other. Any one of the first columns 311a is intersected with at least two of the second columns 311b, and any one of the second columns 311b is intersected with at least two of the first columns 311a.

The patterned slot layout 31 (or the slots 311) can be formed as the structure shown in FIG. 5 and FIG. 6. Specifically, surface areas of the slots 311 are the same, and the slots 311 have the same size (e.g., the same diameter and the same depth). Moreover, in any one of the first columns 311a (or the second columns 311b), any two of the slots 311 adjacent to each other have the same interval Ga.

Figure 7:
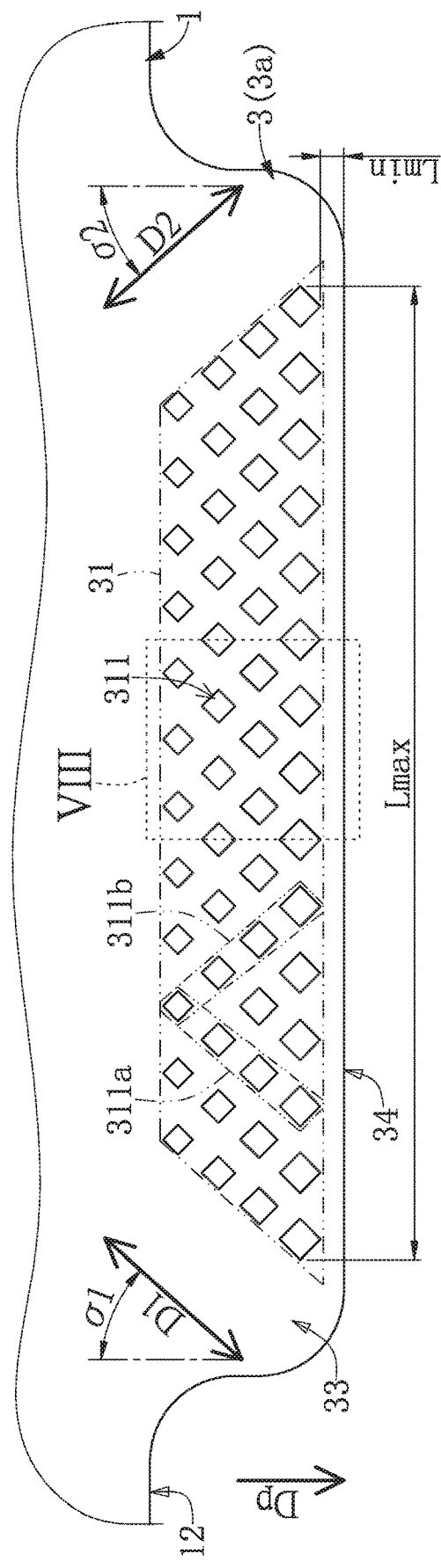
FIG. 7 is a partially planar view of an electromagnetic shielding frame in another configuration according to the first embodiment of the present disclosure.
Figure 8:
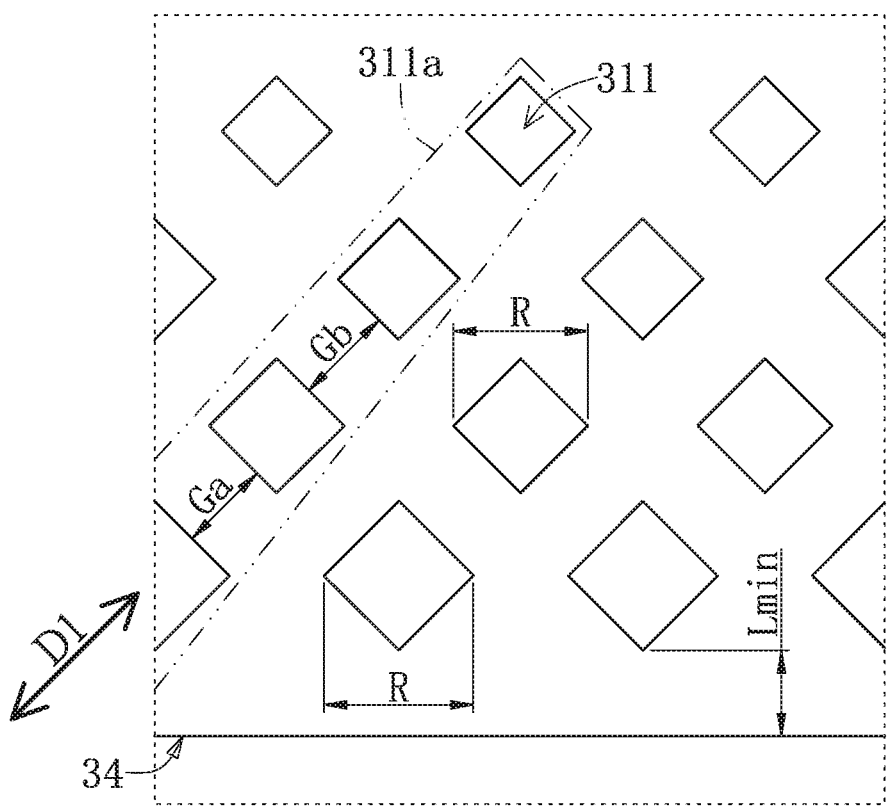
FIG. 8 is an enlarged view of part VIII of FIG. 7.

In addition, the patterned slot layout 31 (or the slots 311) can be formed as the layout shown in FIG. 7 and FIG. 8. Specifically, in any one of the first columns 311a, surface areas of the slots 311 gradually decrease along the first direction D1 and along a direction away from the bottom side 34. In any one of the first columns 311a, the slots 311 have the substantially same depth, and maximum outer diameters R of the slots 311 gradually decrease along the first direction D1 and along a direction away from the bottom side 34. However, in other embodiments of the present disclosure, in any one of the first columns 311a, the maximum outer diameters R of the slots 311 can be substantially the same, and the depths of the slots 311 gradually decrease along the first direction D1 and along a direction away from the bottom side 34.

Moreover, as shown in FIG. 7 and FIG. 8, in any one of the first columns 311a, any two of the slots 311 adjacent to each other have an interval Ga, Gb therebetween. Furthermore, in any two of the intervals Ga, Gb adjacent to each other along the first direction D1, one of the any two of the intervals Ga, Gb arranged adjacent to the bottom side 34 (e.g., the interval Ga) is smaller than or equal to the other one of the any two of the intervals Ga, Gb arranged away from the bottom side 34 (e.g., the interval Gb).

As shown in FIG. 5 and FIG. 7, the patterned slot layout 31 (or the slots 311) provided in the preferable arrangement is described in the above description. In order to firmly combine any one of the patterned tabs 3a of the electromagnetic shielding frame 100 and the corresponding solder 400, the patterned slot layout 31 is spaced apart from the bottom side 34 of the patterned tab 3a by a minimum preload distance Lmin.

Figure 9:
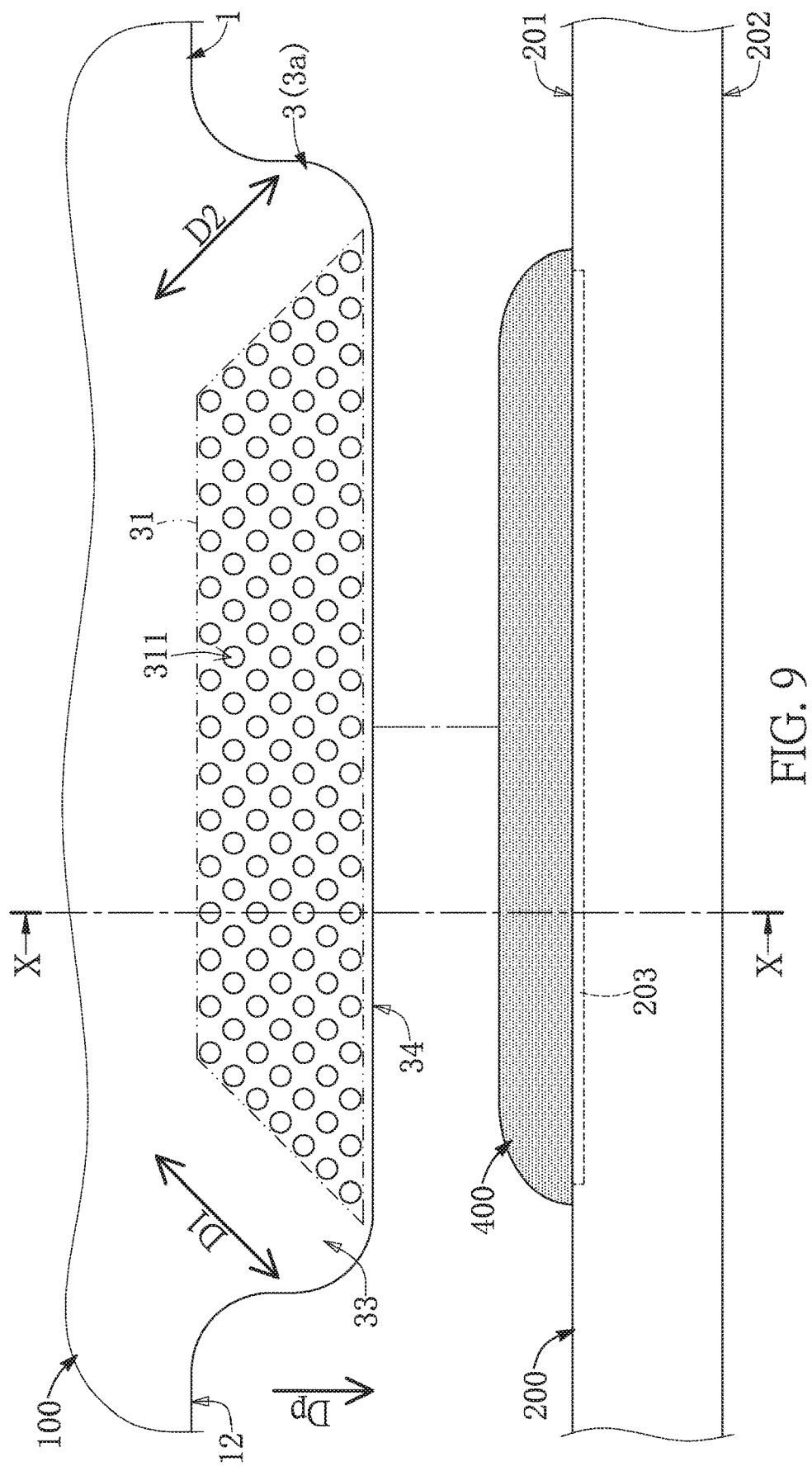
FIG. 9 is a planar view showing a patterned tab not connected to a solder according to the first embodiment of the present disclosure.
Figure 11:
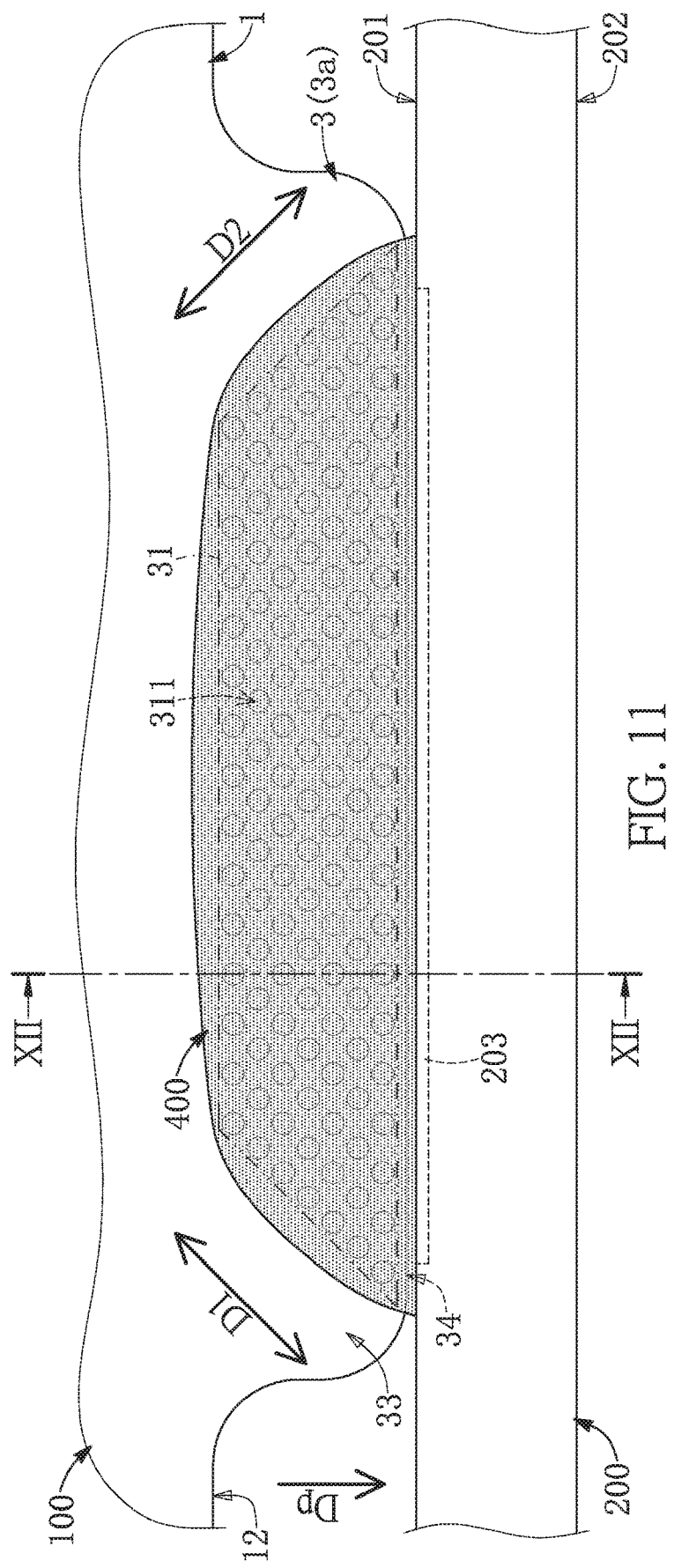
FIG. 11 is a planar view showing the patterned tab connected to the solder according to the first embodiment of the present disclosure.

Specifically, as shown in FIG. 9 and FIG. 10, before the patterned tab 3a is soldered onto the corresponding solder 400, the bottom side 34 of the patterned tab 3a is pressed into the solder 400 by at least the minimum preload distance Lmin, and then a soldering process can be implemented. Accordingly, as shown in FIG. 11 and FIG. 12, during the soldering process, the patterned tab 3a is configured to allow the corresponding solder 400 to easily climb onto the patterned slot layout 31 (e.g., at least part of the slots 311) for ensuring being adhered with enough volume of the solder 400.

The minimum preload distance Lmin in the present embodiment is smaller than or equal to 50% of a coplanarity defined by the soldering tabs 3. The coplanarity in the present embodiment is defined as follows. Three of the soldering tabs 3 having lowest bottom side jointly define a datum plane by the bottom sides thereof, and each of the other soldering tabs 3 is compared with the datum plane to obtain a maximum offset that is defined as the coplanarity of the present embodiment. Specifically, the coplanarity of the soldering tabs 3 in the present embodiment is 0.1 mm, and the minimum preload distance Lmin is smaller than or equal to 0.05 mm, but the present disclosure is not limited thereto. For example, in other embodiments of the present disclosure, the minimum preload distance Lmin can be 0. In other words, the slots 311 of the lowest row of the patterned slot layout 31 are formed on the bottom side 34 of the patterned tab 3a.

Figure 2:
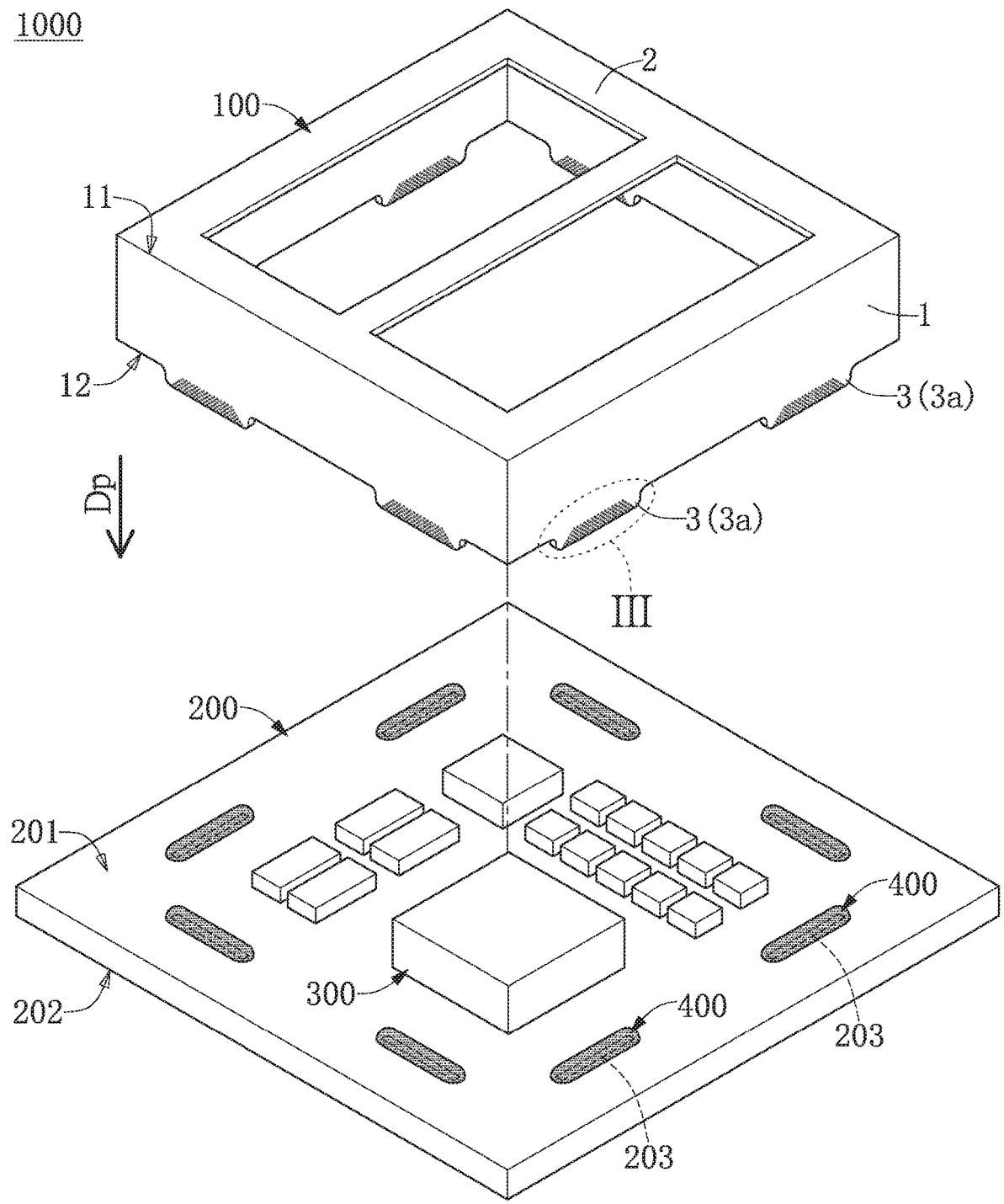
FIG. 2 is an exploded view of FIG. 1.

The above description describes the structure of the electromagnetic shielding frame 100 of the present embodiment, and the following description describes the structure and connection relationship of other components of the electronic device 1000. As shown in FIG. 1 and FIG. 2, the circuit board 200 has a first board surface 201 and a second board surface 202 that is opposite to the first board surface 201. The circuit board 200 includes a plurality of soldering pads 203 arranged on the first board surface 201 in a ring-shaped arrangement. The soldering pads 203 are spaced apart from each other and respectively correspond in position to the soldering tabs 3.

Moreover, as shown in FIG. 1, FIG. 2, FIG. 11, and FIG. 12, the solders 400 (e.g., solder pastes) are respectively disposed on the soldering pads 203, and the solders 400 are connected to (and cover) the soldering tabs 3, respectively, so that the electromagnetic shielding frame 100 can be structurally and electrically connected to the circuit board 200 through the solders 400. Moreover, the patterned tab 3a is configured to allow the corresponding solder 400 to climb onto (and cover) the patterned slot layout 31 (e.g., at least part of the slots 311) along the first direction D1 and the second direction D2 (by surface energy generated from the patterned slot layout 31).

Specifically, when a climbing portion of the solder 400 climbs from the slots 311 of the lowest row to the slots 311 of the second lowest row along the first direction D1 or the second direction D2, the climbing portion just needs to overcome a partial gravity thereof (i.e., the gravity of the climbing portion multiplies cos σ1). Moreover, when the solder 400 continues to upwardly climb, the volume of the climbing portion will gradually decrease by the patterned slot layout 31, so that the surface energy can be concentrated to facilitate the solder 400 to upwardly climb.

Since the soldering tab 3 (or the patterned tab 3a) is formed with the patterned slot layout 31, the solder 400 can climb onto at least part of the slots 311 along the first direction D1 or the second direction D2. Accordingly, surface area of the soldering tab 3 (or the patterned tab 3a) covered by the solder 400 can be effectively increased, and the connection between the soldering tab 3 (or the patterned tab 3a) and the corresponding solder 400 can be more firm.

In addition, after the solder 400 climbs onto (and covers) the patterned slot layout 31, the solder 400 is shaped along the contour of the patterned slot layout 31 (or the outer slots 311), so that a lateral side of the solder 400 and the protruding direction Dp have an angle therebetween that is substantially within a range of 30 to 60 degrees. Accordingly, the solder 400 can easily have an accumulation effect for firmly connecting the patterned tab 3a and the corresponding solder 400.

In the present embodiment, the at least one electronic component 300 is mounted on the first board surface 201 of the circuit board 200, and is arranged in an accommodating space S surroundingly defined by the electromagnetic shielding frame 100 and the circuit board 200.

Second Embodiment

Figure 13:
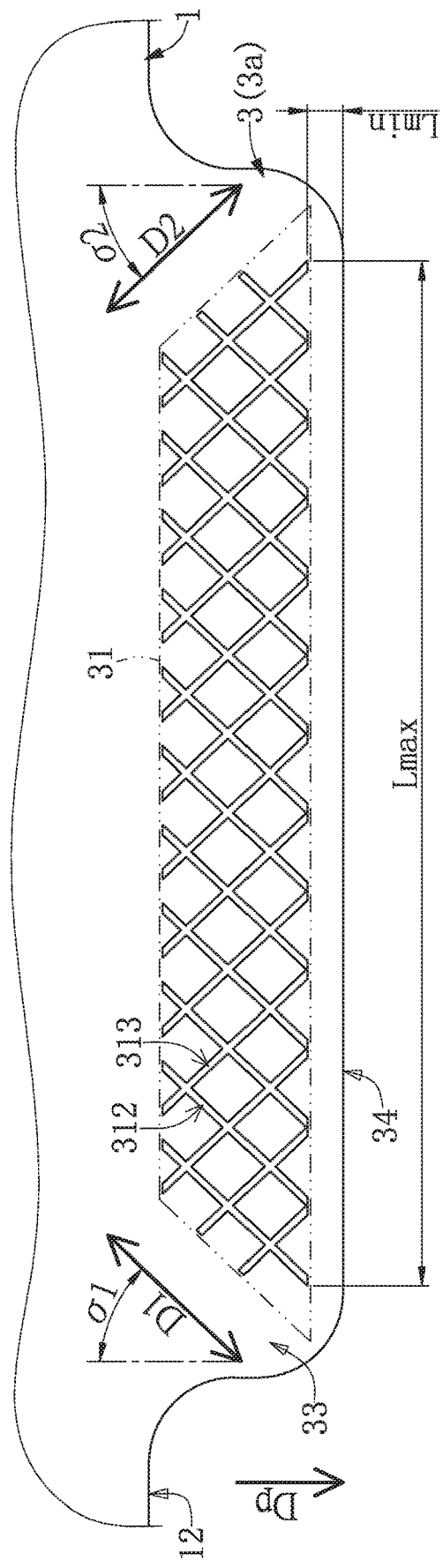
FIG. 13 is a partially planar view of an electromagnetic shielding frame according to a second embodiment of the present disclosure.

Referring to FIG. 13, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In the present embodiment, the patterned slot layout 31 includes a plurality of first elongated slots 312 and a plurality of second elongated slots 313 that intersect with the first elongated slots 312, and does not have the slots 311 as disclosed in the first embodiment. Each of the first elongated slots 312 is parallel to the first direction D1, and each of the second elongated slots 313 is parallel to the second direction D2. Moreover, any one of the first elongated slots 312 is intersected with at least two of the second elongated slots 313, and any one of the second elongated slots 313 is intersected with at least two of the first elongated slots 312.

In conclusion, since the soldering tab (or the patterned tab) of the electromagnetic shielding frame in the present disclosure is formed with the patterned slot layout, the solder can climb onto at least part of the slots along the first direction or the second direction. Accordingly, surface area of the soldering tab (or the patterned tab) covered by the solder can be effectively increased, and the connection between the soldering tab (or the patterned tab) and the corresponding solder can be more firm.

In addition, after the solder climbs onto (and covers) the patterned slot layout, the solder is shaped along the contour of the patterned slot layout, so that a lateral side of the shaped solder and the protruding direction have an angle therebetween that is substantially within a range of 30 to 60 degrees. Accordingly, the solder can easily have an accumulation effect for firmly connecting the patterned tab and the corresponding solder.

In addition, before the patterned tab is soldered onto the corresponding solder, the bottom side of the patterned tab is pressed into the solder by at least the minimum preload distance, and then a soldering process can be implemented. Accordingly, during the soldering process, the patterned tab is configured to allow the corresponding solder to easily climb onto the patterned slot layout (i.e., at least part of the slots) for ensuring being adhered with enough volume of the solder.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device, comprising:
   an electromagnetic shielding frame including:
   a ring-shaped portion; and
   a plurality of soldering tabs extending from the ring-shaped portion along a protruding direction, wherein the soldering tabs are spaced apart from each other and are in a ring-shaped arrangement, wherein at least one of the soldering tabs has a patterned slot layout so as to be defined as a patterned tab, wherein the patterned tab includes a bottom side arranged away from the ring-shaped portion, and a portion of the patterned slot layout of the patterned tab arranged adjacent to the bottom side has a layout distance,
   wherein the patterned slot layout is arranged along a first direction and a second direction, and wherein the first direction and the protruding direction have a first angle therebetween that is smaller than 90 degrees, and the second direction and the protruding direction have a second angle therebetween that is smaller than 90 degrees;
   a circuit board having a first board surface and a second board surface that is opposite to the first board surface, wherein the circuit board includes a plurality of soldering pads arranged on the first board surface in a ring-shaped arrangement, and the soldering pads are spaced apart from each other and respectively correspond in position to the soldering tabs;
   an electronic component mounted on the first board surface of the circuit board, wherein the electronic component is arranged in an accommodating space surroundingly defined by the electromagnetic shielding frame and the circuit board; and a plurality of solders respectively disposed on the soldering pads, wherein the solders are connected to the soldering tabs, respectively, and wherein the patterned tab has an inner surface and an outer surface, and each of the inner surface and the outer surface of the patterned tab is formed with the patterned slot layout that does not penetrate through the patterned tab, so that the patterned tab is configured to allow the corresponding solder to climb thereon along the patterned slot layout in the first direction and the second direction so as to extend away from the bottom side.

2. The electronic device according to claim 1, wherein the patterned slot layout includes a plurality of slots spaced apart from each other, and wherein the slots of the patterned slot layout are arranged in a plurality of first columns each parallel to the first direction and a plurality of second columns each parallel to the second direction, and the first columns and the second columns intersect with each other.

3. The electronic device according to claim 2, wherein in any one of the first columns, any two of the slots adjacent to each other have an interval therebetween, and wherein in any two of the intervals adjacent to each other along the first direction, one of the any two of the intervals arranged adjacent to the bottom side is smaller than or equal to the other one of the any two of the intervals arranged away from the bottom side.

4. The electronic device according to claim 3, wherein in any one of the first columns, surface areas of the slots decrease along the first direction and along a direction away from the bottom side.

5. The electronic device according to claim 3, wherein in any one of the first columns, maximum outer diameters of the slots decrease along the first direction and along a direction away from the bottom side.

6. The electronic device according to claim 1, wherein the patterned slot layout includes a plurality of first elongated slots and a plurality of second elongated slots that intersect with the first elongated slots, wherein each of the first elongated slots is parallel to the first direction, and each of the second elongated slots is parallel to the second direction, and wherein any one of the first elongated slots intersects with at least two of the second elongated slots, and any one of the second elongated slots intersects with at least two of the first elongated slots.

7. The electronic device according to claim 1, wherein the soldering tabs extend from a ring-shaped bottom edge of the ring-shaped portion, a contour of the patterned slot layout is in a trapezoid shape, and the patterned slot layout does not extend across the ring-shaped bottom edge and is not formed on the ring-shaped portion.

8. The electronic device according to claim 1, wherein the inner surface of the patterned tab faces the electronic component, and the outer surface of the patterned tab is arranged away from the electronic component.

9. The electronic device according to claim 8, wherein a projection region defined by orthogonally projecting the patterned slot layout of the outer surface onto the inner surface is overlapped with the patterned slot layout of the inner surface.

10. The electronic device according to claim 1, wherein the first angle is within a range of 30 to 60 degrees, and a difference between the first angle and the second angle is smaller than or equal to 10 degrees.

11. The electronic device according to claim 1, wherein the soldering tabs jointly define a coplanarity, and the patterned slot layout and the bottom side of the patterned tab have a minimum preload distance therebetween that is smaller than or equal to 50% of the coplanarity.

12. The electronic device according to claim 11, wherein the minimum preload distance is smaller than or equal to 0.05 mm.

13. An electromagnetic shielding frame, comprising:
a ring-shaped portion; and
a plurality of soldering tabs extending from the ring-shaped portion along a protruding direction, wherein the soldering tabs are spaced apart from each other and are in a ring-shaped arrangement, wherein at least one of the soldering tabs has a patterned slot layout so as to be defined as a patterned tab, wherein the patterned slot layout is recessed on a surface of the patterned tab by a depth that is less than a thickness of the patterned tab, and wherein the patterned tab includes a bottom side arranged away from the ring-shaped portion, and a portion of the patterned slot layout of the patterned tab arranged adjacent to the bottom side has a layout distance,
wherein the patterned slot layout is arranged along a first direction and a second direction, and wherein the first direction and the protruding direction have a first angle therebetween that is smaller than 90 degrees, and the second direction and the protruding direction have a second angle therebetween that is smaller than 90 degrees, and wherein the patterned tab has an inner surface and an outer surface, and each of the inner surface and the outer surface of the patterned tab is formed with the patterned slot layout that does not penetrate through the patterned tab.

14. The electromagnetic shielding frame according to claim 13, wherein the first angle is within a range of 30 to 60 degrees, and a difference between the first angle and the second angle is smaller than or equal to 10 degrees.

15. The electromagnetic shielding frame according to claim 14, wherein the patterned slot layout includes a plurality of slots spaced apart from each other, and wherein the slots of the patterned slot layout are arranged in a plurality of first columns each parallel to the first direction and a plurality of second columns each parallel to the second direction, and the first columns and the second columns intersect with each other.

16. The electromagnetic shielding frame according to claim 15, wherein in any one of the first columns, any two of the slots adjacent to each other have an interval therebetween, and wherein in any two of the intervals adjacent to each other along the first direction, one of the any two of the intervals arranged adjacent to the bottom side is smaller than or equal to the other one of the any two of the intervals arranged away from the bottom side.

17. The electromagnetic shielding frame according to claim 13, wherein the soldering tabs extend from a ring-shaped bottom edge of the ring-shaped portion, a contour of the patterned slot layout is in a trapezoid shape, and the patterned slot layout does not extend across the ring-shaped bottom edge and is not formed on the ring-shaped portion.

18. The electromagnetic shielding frame according to claim 13, wherein the patterned slot layout and the bottom side of the patterned tab have a minimum preload distance therebetween that is smaller than or equal to 0.05 mm.

* * * * *